(12) United States Patent
Park et al.

(10) Patent No.: US 12,733,460 B2
(45) Date of Patent: Sep. 8, 2026

(54) SUBSTRATE INCLUDING TEST CIRCUIT AND SUBSTRATE TEST APPARATUS INCLUDING THE SUBSTRATE

(71) Applicant: Samsung Electronics Co., Ltd., Suwon-si (KR)

(72) Inventors: Junghyun Park, Suwon-si (KR); Yongil Kwak, Suwon-si (KR); Jekook Lyu, Suwon-si (KR); Heeju Seo, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 423 days.

(21) Appl. No.: 18/364,119

(22) Filed: Aug. 2, 2023

(65) Prior Publication Data

US 2024/0194542 A1 Jun. 13, 2024

(30) Foreign Application Priority Data

Dec. 13, 2022 (KR) ........................ 10-2022-0174194

(51) Int. Cl.

*G01R 31/28* (2006.01)
*H10P 74/00* (2026.01)
*H10W 90/00* (2026.01)

(52) U.S. Cl.

CPC ........ *H10P 74/277* (2026.01); *G01R 31/2893* (2013.01); *H10P 74/273* (2026.01); *H10W 90/00* (2026.01)

(58) Field of Classification Search

CPC ..... H01L 22/34; H01L 22/32; H01L 25/0655; G01R 31/2893
USPC ........................................................... 257/48
See application file for complete search history.

(56) References Cited

U.S. PATENT DOCUMENTS

| | | | | |
|---|---|---|---|---|
| 10,923,407 | B2 | 2/2021 | Kim et al. | |
| 11,342,234 | B2 | 5/2022 | Kim et al. | |
| 2017/0358507 | A1* | 12/2017 | Mori | H10P 74/273 |
| 2018/0226339 | A1* | 8/2018 | Kim | H10W 20/496 |
| 2019/0064219 | A1* | 2/2019 | Rhee | G01R 1/07378 |
| 2019/0139841 | A1* | 5/2019 | Stamper | H10P 54/00 |

(Continued)

FOREIGN PATENT DOCUMENTS

| | | |
|---|---|---|
| CN | 201156865 Y | 11/2008 |
| CN | 112924841 A | 6/2021 |

(Continued)

*Primary Examiner* — Moazzam Hossain
(74) *Attorney, Agent, or Firm* — Harness, Dickey & Pierce, P.L.C.

(57) ABSTRACT

Provided are a substrate including a test circuit capable of testing a damaged state thereof. The substrate includes a substrate body, and a test circuit arranged on at least one of an upper surface and a lower surface of the substrate body, wherein the test circuit includes two contact pads and at least one test wiring, the two contact pads being at an end portion of the substrate body and configured to contact two probe pins of a test element, the test wiring extending to surround an outer periphery portion of the substrate body and configured to connect the two contact pads to each other, and wherein, in an electrical test using the test element, when the test wiring is in a closed state, the substrate body is determined as normal, and when the test wiring is in an open state, the substrate body is determined as defective.

20 Claims, 23 Drawing Sheets

(56) References Cited

U.S. PATENT DOCUMENTS

| | | | | |
|---|---|---|---|---|
| 2022/0320016 | A1* | 10/2022 | Patil | G01R 3/00 |
| 2023/0038603 | A1* | 2/2023 | Choi | H10P 74/273 |
| 2023/0253271 | A1* | 8/2023 | Blin | H10P 74/23<br>257/48 |

FOREIGN PATENT DOCUMENTS

| | | | |
|---|---|---|---|
| CN | 113473826 | B | 10/2021 |
| CN | 215375725 | U | 12/2021 |
| JP | 2004-214430 | A | 7/2004 |
| KR | 10-0185359 | B1 | 3/1999 |
| KR | 10-2016-0108930 | A | 9/2016 |

* cited by examiner 100
130
110
B
124a
(124)
122a
(122)
120a
(120)
A
GH
C
D
X
Y
Z

SUBSTRATE INCLUDING TEST CIRCUIT AND SUBSTRATE TEST APPARATUS INCLUDING THE SUBSTRATE

CROSS-REFERENCE TO RELATED APPLICATION

This application is based on and claims priority under 35 U.S.C. § 119 to Korean Patent Application No. 10-2022-0174194, filed on Dec. 13, 2022 in the Korean Intellectual Property Office, the disclosure of which is incorporated by reference herein in its entirety.

BACKGROUND

The inventive concepts relate to test apparatuses, and more particularly, to substrate test apparatuses testing the state of a substrate.

Due to the trend of lightweight, thin, short, and small size of a semiconductor package, the substrate used in the packaging process is continuously becoming thinner. Accordingly, damage may often occur in the substrate due to physical damage during the process. For example, damage to the substrate may include damage such as cracking, tearing, and partial loss of the substrate body. Such damage to the substrate may cause serious defects in the substrate itself as well as in the semiconductor chip mounted on the substrate or the semiconductor processing equipment.

SUMMARY

Some example embodiments of the inventive concepts provide substrates including a test circuit capable of testing a damaged state thereof, and substrate test apparatuses including such substrates.

In addition, the issues to be solved by the inventive concepts are not limited to those mentioned above, and other issues may be clearly understood by those of ordinary skill in the art from the following descriptions.

According to an aspect of the inventive concepts, a substrate includes a substrate body, and a test circuit on at least one of an upper surface and a lower surface of the substrate body, wherein the test circuit includes two contact pads and at least one test wiring, the two contact pads being at an end portion of the substrate body and configured to contact two probe pins of a test element, the test wiring extending to surround an outer periphery portion of the substrate body and configured to connect the two contact pads to each other, and wherein, in an electrical test using the test element, when the test wiring is in a closed state, the substrate body is determined as normal, and when the test wiring is in an open state, the substrate body is determined as defective.

According to another aspect of the inventive concepts, a substrate test apparatus includes a substrate including a substrate body, and a test circuit arranged on at least one of an upper surface and a lower surface of the substrate body, and a test element configured to test the substrate, wherein the test circuit includes two contact pads and at least one test wiring, the two contact pads being at an end portion of the substrate body and configured to contact two probe pins of the test element, and the test wiring extending to surround an outer periphery portion of the substrate body and configured to connect the two contact pads to each other, and in an electrical test using the test element, the substrate test apparatus is configured to determine the substrate as normal when the test wiring is in a closed state, and determine the substrate as defective when the test wiring is in an open state.

According to another aspect of the inventive concepts, a substrate test apparatus includes a substrate including a substrate body and a test circuit, the test circuit on at least one of an upper surface and a lower surface of the substrate body, a test element configured to test the substrate, and a substrate movement apparatus configured to move the substrate, the substrate movement apparatus having at least some components of the test element thereon, wherein the test circuit includes two contact pads and at least one test wiring, the two contact pads being at an end portion of the substrate body and configured to contact two probe pins of the test element, the test wiring extending to surround an outer periphery portion of the substrate body and configured to connect the two contact pads to each other, and when the substrate movement apparatus contacts the substrate, the test element is configured to perform an electrical test on the substrate, and, in the electrical test, the substrate test apparatus is configured to determine the substrate as normal when the test wiring is in a closed state, and determine the substrate as defective when the test wiring is in an open state.

BRIEF DESCRIPTION OF THE DRAWINGS

Example embodiments will be more clearly understood from the following detailed description taken in conjunction with the accompanying drawings in which.

DETAILED DESCRIPTION

Figure 1A:
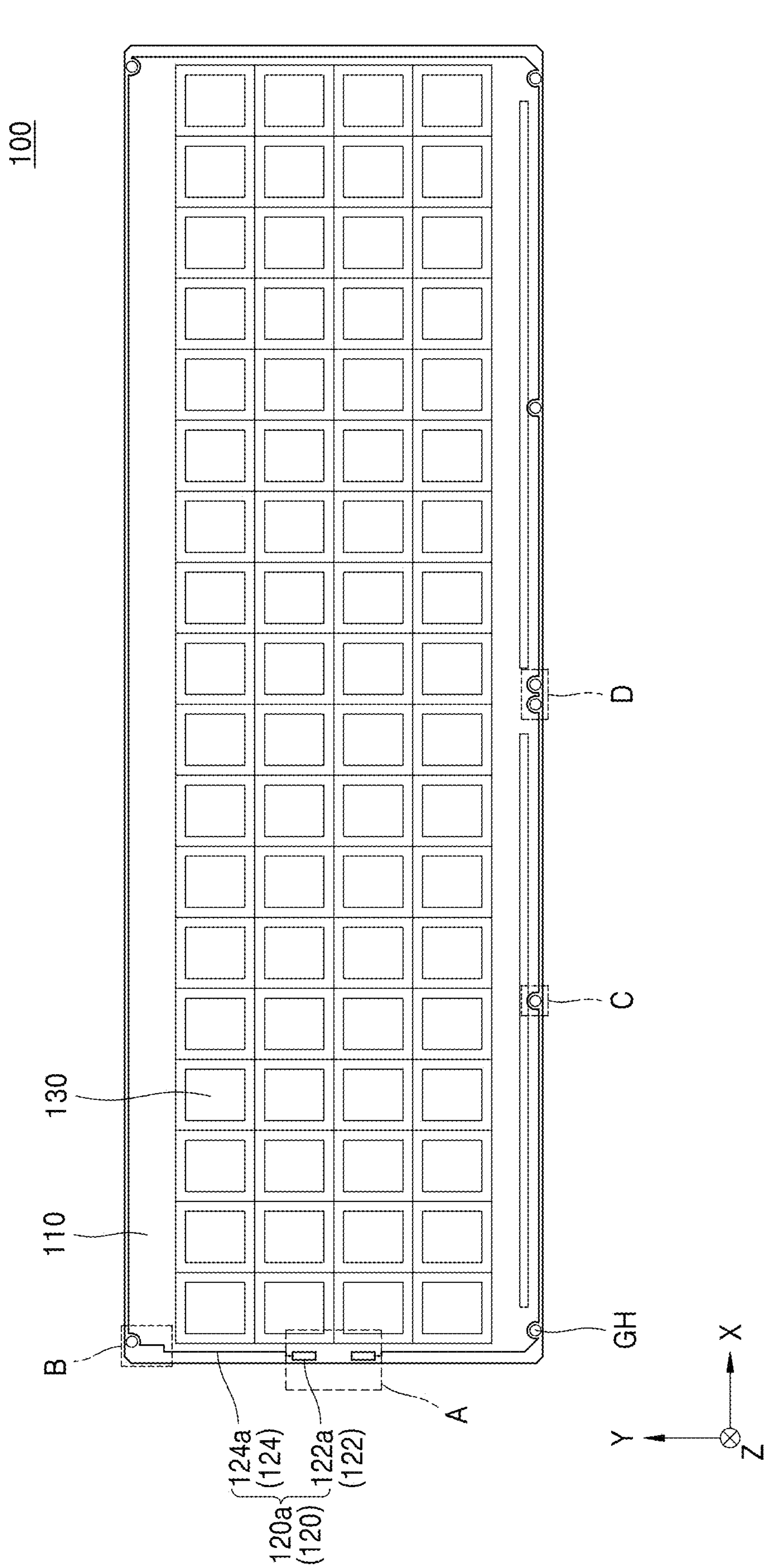
FIGS. 1A through 1D are plan views and enlarged views of a substrate including a test circuit, according to an example embodiment.
Figure 1B:
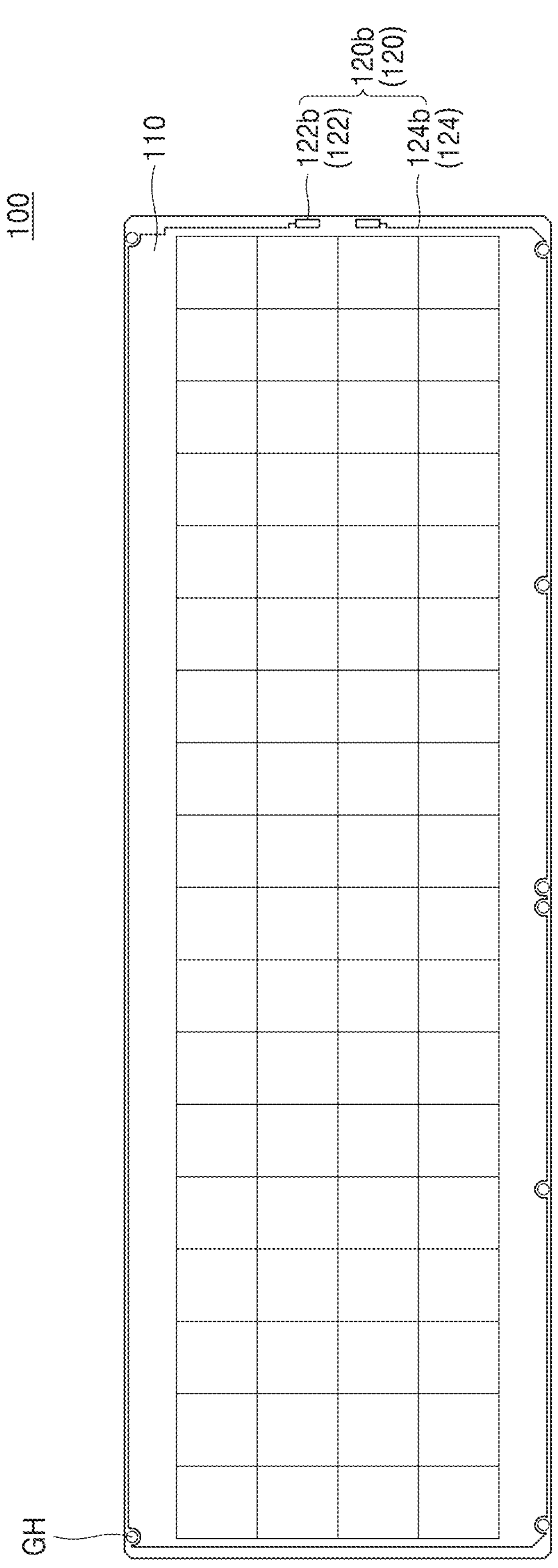
Figure 1C:
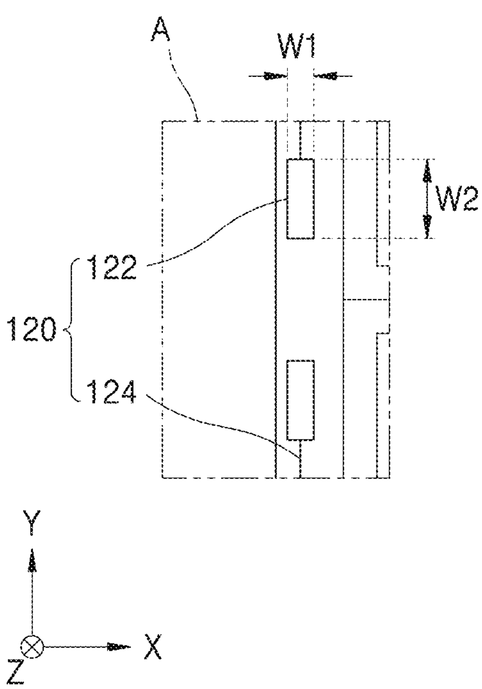
Figure 1D:
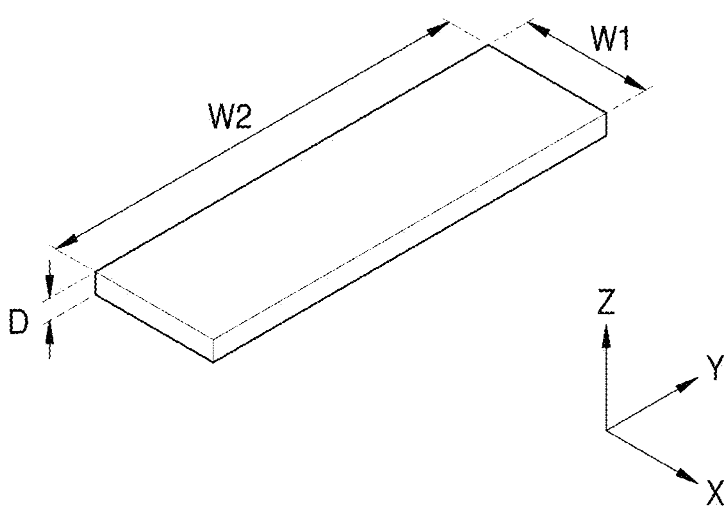

Hereinafter, some example embodiments of the inventive concepts will be described in detail with reference to the accompanying drawings. Identical reference numerals are used for the same constituent elements in the drawings, and duplicate descriptions thereof are omitted.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., +10%).

When the terms "about" or "substantially" are used in this specification in connection with a numerical value, it is intended that the associated numerical value includes a manufacturing or operational tolerance (e.g., +10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., +10%) around the stated numerical values or shapes.

As used herein, expressions such as "at least one of," when preceding a list of elements, modify the entire list of elements and do not modify the individual elements of the list. Thus, for example, both "at least one of A, B, or C" and "at least one of A, B, and C" mean either A, B, C or any combination thereof. Likewise, A and/or B means A, B, or A and B.

FIGS. 1A through 1D are plan views and enlarged views of a substrate including a test circuit, according to an example embodiment.

Referring to FIGS. 1A through 1D, a substrate including a test circuit (100, hereinafter, simply referred to as a 'substrate') of the present example embodiment may include a substrate body 110, a test circuit 120, and a semiconductor chip 130. The substrate 100 of the present example embodiment may include, for example, a printed circuit board (PCB). However, the substrate 100 is not limited thereto. For example, the substrate 100 may include a ceramic substrate, a glass substrate, or an interposer substrate. According to an example embodiment, the substrate 100 may include a wafer such as a silicon (Si) wafer.

Figure 2A:
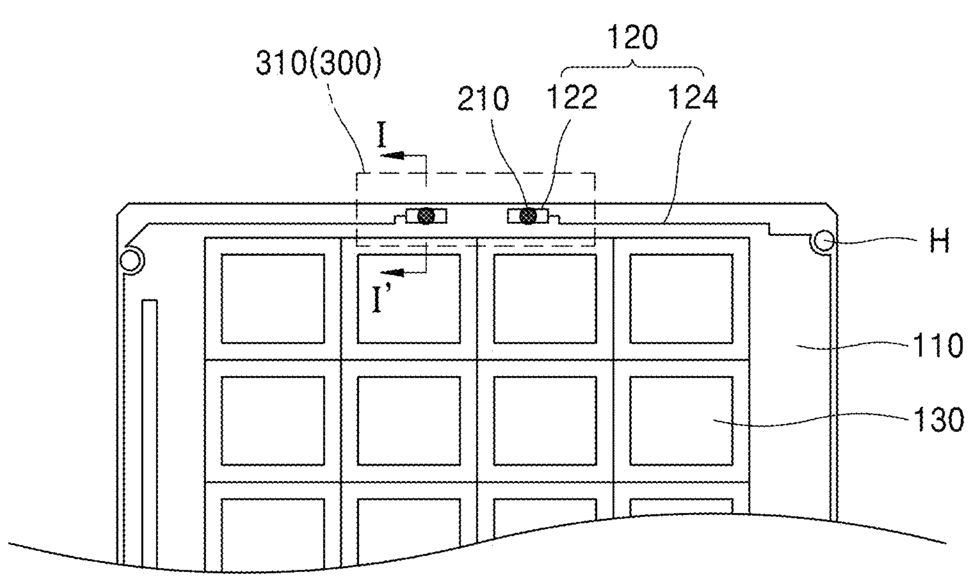
FIGS. 2A and 2B are a plan view and a cross-sectional view of a state, respectively, in which the substrate of FIG. 1A is coupled with a gripper.
Figure 2B:
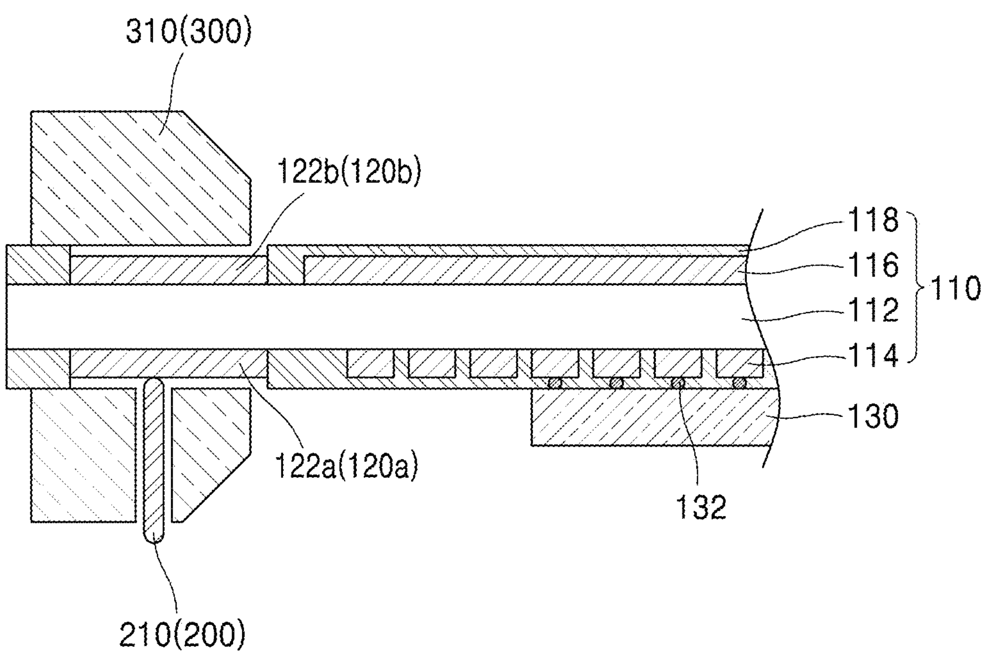

The substrate body 110 may include a body layer (refer to 112 in FIG. 2B), upper and lower circuit wirings (refer to 114 and 116 in FIG. 2B, respectively), and a protection layer (refer to 118 in FIG. 2B). The body layer 112 may be formed with a certain thickness by compressing epoxy glass (or FR-4) resin, photo imageable dielectric (PID) resin, phenol resin, bismaleimide triazine (BT) resin, or the like. However, the material of the body layer 112 is not limited thereto.

The upper and lower circuit wirings 114 and 116 may be arranged on the body layer 112, and the upper wiring 114 may be arranged on an upper surface of the body layer 112 and the lower wiring 116 arranged on a lower surface of the body layer 112. In the substrate 100 of the present example embodiment, the upper surface of the body layer 112 may mean a surface on which the semiconductor chips 130 are mounted, and the lower surface of the body layer 112 may mean a surface opposite thereto. On the other hand, external connection terminals such as solder balls may be arranged on the lower surface of the body layer 112. The upper and lower circuit wirings 114 and 116 may be respectively formed by patterning a copper (Cu) foil coated on the upper and lower surfaces of the body layer 112.

A protection layer 118 may cover and protect the upper and lower circuit wirings 114 and 116. The protection layer 118 may include, for example, a solder resist (SR). The protection layer 118 may cover the upper and lower circuit wirings 114 and 116, but may open a substrate pad portion. On the substrate pad portion, a bump (refer to 132 in FIG. 2B), and the external connection terminal, or the like may be arranged. The substrate pad portion may include portions of the upper and lower wirings 114 and 116, or may be formed separately on the upper and lower wirings 114 and 116.

For reference, the substrate body 110 may be distinguished into a single-layer PCB with circuit wirings formed on only one side, and as a double-sided PCB with circuit wirings formed on both sides. The substrate body 110 of the present example embodiment may be used as a double-sided PCB. In the case of the substrate body 110 as a double-sided PCB, the upper and lower circuit wirings 114 and 116 may be electrically connected to each other via a via contact penetrating the body layer 112. According to some example embodiments, the substrate body 110 may include three or more layers of Cu foil by using an insulator called prepreg, and depending on the number of layers of Cu foil, the wiring circuits may include three or more layers.

The substrate body 110 may have a rectangular strip structure extending in the first direction (X direction). Due to the rectangular strip structure of the substrate body 110, the substrate 100 of the present example embodiment may be referred to as a PCB strip. The substrate body 110 may be divided into an active region and a dummy region. The active region may be at the central portion of an upper surface of the substrate body 110, and may include the semiconductor chips 130 mounted thereon. The dummy region may be arranged outside the active region, and may correspond to an edge portion of the upper surface of the substrate body 110. On the dummy region, a guide ring GH may be provided for aligning the substrate 100 with respect to an upper mold (refer to 410 in FIG. 6A) during the molding process. The guide ring GH may have a through hole structure penetrating the substrate body 110.

On the active region, the semiconductor chips 130 may be mounted in a two-dimensional array structure via fine bumps. The two-dimensional array structure may include, for example, a 4*18 array structure. However, the two-dimensional array structure is not limited thereto. For example, the two-dimensional array structure may be variously changed according to the area of the substrate 100 and the size of the semiconductor chips 130 to be mounted thereon.

On the other hand, substantial distinction between the active region and the dummy region may be realized by a saw lane defined at the outermost portion of the active region. The saw lane may correspond to a line, on which cutting is performed in a saw/sorter process of individualizing the semiconductor chips 130 into individual semiconductor packages, after a molding process of sealing the semiconductor chips 130 with a molding resin. In other words, when the individual semiconductor packages are completed, the active region and the dummy region may be distinguished by whether they remain as portions of the semiconductor package, or they are discarded regions.

The test circuit 120 may be arranged on each of the upper surface and a lower surface of the substrate body 110. For example, the test circuit 120 may include a first test circuit 120*a* arranged on the upper surface of the substrate body 110 and a second test circuit 120*b* arranged on the lower surface of the substrate body 110. However, in some example embodiments, the test circuit 120 may also be arranged on only one of the upper and lower surfaces of the substrate body 110. For example, when a probe pin (refer to 210 in FIG. 2B) of a test element (refer to 200 in FIG. 7A) is arranged to contact a contact pad 122 on the upper surface of the substrate body 110, the test circuit 120 may be arranged only on the upper surface of the substrate body 110. On the other hand, when the probe pin 210 is arranged to contact each of the contact pads 122 on the upper and lower surfaces of the substrate body 110, the test circuit 120 may be arranged on each of the upper and lower surfaces of the substrate body 110.

The test circuit 120 may include the contact pad 122 and a test wiring 124. The contact pad 122 may be arranged adjacent to any one of two short sides of the substrate body 110. For example, the contact pad 122 may be adjacent to one of the two short sides at a central portion thereof in a second direction (Y direction) perpendicular to the first direction (X direction). For example, in the substrate 100 of the present example embodiment, the contact pad 122 may be arranged on a short side portion of the substrate 100, on which a gripper (refer to 300 in FIG. 4A) grips the substrate 100 during a molding process. The gripper 300 may include a device holding the substrate 100 and inserting the substrate 100 onto a rail (refer to 600 in FIG. 7A) in a molding process.

The contact pad 122 may have a rectangular shape. For example, the contact pad 122 may have a first width W1 in the first direction (X direction) and a second width W2 in the second direction (Y direction). The first width W1 and the second width W2 may be about 1 mm and 4 mm, respectively. However, the first width W1 and the second width W2 are not limited thereto. Two contact pads 122 may be arranged to correspond to the (+) and the (−) of the probe pin 210 of the test element 200, and the two contact pads 122 may be connected to each other via the test wiring 124.

The test wiring 124 may be arranged in a structure to surround an outer periphery portion of the substrate body 110. The test wiring 124 may have a width of about 0.05 mm. However, the width of the test wiring 124 is not limited thereto. For example, the test wiring 124 may be formed on the body layer 112, similar to the upper and lower circuit wirings 114 and 116. In addition, the test wiring 124 may be arranged in a structure to surround an outer periphery portion of the dummy region of the substrate body 110. The test wiring 124 may extend from any one contact pad 122 of the two contact pads 122, and along a portion of a first short side, a first long side, a second short side opposite to the first short side, a second long side opposite to the first long side, and another portion of the first short side, and may be connected to the other one contact pad 122 of the two contact pads 122. The structure of the test wiring 124 in the guide ring GH portion of the substrate body 110 is described in more detail in the descriptions with reference to FIGS. 3A through 3C.

The contact pad 122 and the test wiring 124 may include, for example, copper (Cu). However, the material of the contact pad 122 and the test wiring 124 is not limited thereto. For example, the contact pad 122 and the test wiring 124 may include other metal materials, such as Al, W, Ni, Co, and Ag, a conductive metal oxide such as $Al_2O_3$, a conductive metal nitride, such as TiN and TaN, or a conductive material such as polysilicon.

The semiconductor chip 130 may be mounted on the upper surface of the substrate body 110. The semiconductor chip 130 may include a memory chip or a logic chip. When the semiconductor chip 130 includes a memory chip, the semiconductor chip 130 may include dynamic RAM (DRAM), static RAM (SRAM), a flash memory, electrically erasable programmable ROM (EEPROM), phase change RAM (PRAM), magnetic RAM (MRAM), resistive RAM (RRAM), etc. When the semiconductor chip 130 includes a logic chip, the semiconductor chip 130 may include a microprocessor, a central processing unit (CPU), a controller, an application-specific integrated circuit (ASIC), etc. In addition, the semiconductor chip 130 may also include a system on chip (SOC) type application processor (AP) used in a mobile system, such as a mobile phone, an MP3 player, navigation, and a portable multimedia player (PMP). In some example embodiments, the semiconductor chip 130 may be excluded from the components of the substrate 100.

The semiconductor chip 130 may be mounted on the substrate body 110 via the bump 132 by using a flip-chip bonding method. The bump 132 may have a small size, for example, about several to tens of μm. The bump 132 may include solder or may be formed in a structure in which solder is stacked on a metal filler. The solder may include, for example, tin (Sn). In some cases, the solder may include palladium (Pd), nickel (Ni), silver (Ag), lead (Pb), or an alloy thereof. The metal filler may include Cu. However, the material of the metal filler is not limited thereto. For example, the metal filler may include aluminum (Al), Ni, gold (Au), or an alloy thereof.

In some example embodiments, the substrate 100 may include a PCB for a molded underfill (MUF) used in an MUF process. For reference, an MUF process may be referred to as a process of sealing an outer periphery portion of a semiconductor chip and a space between a semiconductor chip and a PCB with the same molding resin by using a one-shot molding process. The space portion between the semiconductor chip and the PCB may be generally filled by using an underfill process separate from the molding process, but in the MUF process, may be filled together with the outer portion of the semiconductor chip in the molding process without a separate underfill process.

In other example embodiments, the semiconductor chip 130 may be mounted on the substrate body 110 by using an adhesive layer and a wire bonding. When the semiconductor chip 130 is mounted on the substrate body 110 by using an adhesive layer and a wire bonding, the semiconductor chip 130 may be electrically connected to the upper and lower circuit wirings 114 and 116 of the substrate body 110 via wires.

The substrate 100 of the present example embodiment may include the test circuit 120 on the substrate body 110. Accordingly, in the substrate 100 of the present example embodiment, when a semiconductor process such as a molding process is performed, the state of the substrate 100 may be tested in advance by using the test circuit 120. When the state of the substrate 100 is determined as defective in a test using the test circuit 120, the molding on the substrate 100 may not be proceeded, and thereby, a defect due to a leakage of a molding resin, for example, epoxy molding compound (EMC), may be mitigated or prevented in advance. In this case, the defect caused by the leakage of EMC may include a molding defect, such as a reduction in a molding thickness and void generation on the corresponding substrate, and in addition, may include a failure defect of molding equipment due to EMC flowing into the upper mold. In the case of failure defect of the molding equipment, the failure defect may cause mold replacement and interruption of the molding process, and accordingly, may significantly degrade the productivity of the molding process in terms of cost and time. To the contrary, the substrate 100 of the present example embodiment may use the test circuit 120 to test in advance the state of the substrate 100, and accordingly, may reduce or prevent defects due to the EMC, and thus may mitigate or prevent productivity deterioration of the molding process due to the defects.

As described later, in the case of the substrate 100 of the present example embodiment, the test element 200 of the substrate test device (refer to 1000 in FIG. 7A) may be arranged in the gripper 300 portion of the molding equipment, and when the molding process starts, may perform a test on the substrate 100 in real time and easily.

FIGS. 2A and 2B are a plan view and a cross-sectional view illustrating a state, respectively, in which the substrate 100 in FIG. 1A is coupled to the gripper 300, and FIG. 2B is a cross-sectional view taken along line I-I' in FIG. 2A. Descriptions already given with reference to FIGS. 1A through 1D are briefly described or omitted.

Referring to FIGS. 2A and 2B, in the semiconductor process, for example, the molding process, the gripper 300 of the molding equipment may grip the short side portion of the substrate 100 and insert the substrate 100 onto a rail 600. When the gripper 300 grips the substrate 100, the probe pin 210 of the test element 200 arranged in the gripper 300 may contact the contact pad 122 of the test circuit 120 of the substrate 100. As illustrated in FIG. 2B, the probe pin 210 of the test element 200 may be arranged on a lower portion of the gripper 300, and may contact a contact pad **122*a* of the first test circuit 120*a* on an upper surface of the substrate 100**.

The test element 200 may apply a current to the test circuit 120 via the probe pin 210. When the state of the substrate 100 is normal, the test wiring 124 may not be discontinued but in a closed state of being integrally connected, and accordingly, a current may flow through the test circuit 120. For example, when the test element 200 measures the resistance, a resistance value of about several to several tens of Ω may be measured when the test wiring 124 is in a closed state. However, the resistance value in the state, in which the test wiring 124 is closed, is not limited thereto. On the other hand, when the substrate 100 is in a defective state, for example, when there is a crack or tear in the substrate 100, the test wiring 124 may be disconnected in the corresponding portion to be in an open state, and thus, no current may flow through the test circuit 120. For example, when the test element 200 measures the resistance, a large resistance value corresponding to almost infinity (∞) may be measured when the test wiring 124 is open.

The substrate 100 of the present example embodiment may test the state thereof in advance, before the molding process is performed, by using the test element 200 arranged in the gripper 300 and the test circuit 120. Accordingly, defects that may occur when the molding process is subsequently performed on the damaged substrate 100 may be mitigated or prevented in advance, and thus, the productivity of the molding process may be improved.

A molding process of a semiconductor package may include a process of molding by injecting molding resin, for example, EMC, to a half-finished product, in which semiconductor chips are attached on a substrate, and may include a forming process of protecting the semiconductor chips on the substrate from external environment. In the molding process, a mold may include upper and lower molds, the substrate, on which semiconductor chips are attached, may be loaded, quantified EMC may be placed on the lower mold, the upper and lower molds may be interlocked to each other, and a high-pressure and high-heat molding may be performed.

Due to lightness, thinness, shortness, and miniaturization of a semiconductor package, the substrate used in the packaging process is being continuously thinned to about 0.08 mm. Accordingly, damage to the substrate due to physical damage during the packaging process may increase. For example, when a damaged substrate is introduced and molded in a molding process, due to high pressure, EMC may flow into the upper mold through a torn gap, which causes a failure and replacement of the mold equipment. Accordingly, production may be stopped, and in addition, the substrate may be subjected to molding defects, such as a decrease in the thickness and an occurrence of voids, due to leaked EMC.

For reference, the substrate 100 may be significantly damaged at the edges of the short side portion of the substrate 100 exposed from a magazine, and/or at the lock contact units of the magazine. In this case, the magazine may include a type of substrate accommodation container, which accommodates and moves a plurality of substrates, and includes both sides thereof corresponding to the short side portions being opened, and the magazine may expose both side portions of a substrate by using the opened short side portions. The molding process, to which the substrate 100 of the present example embodiment is applied, is described in more detail below in the descriptions with reference to FIGS. 5A through 6D.

Figure 3A:
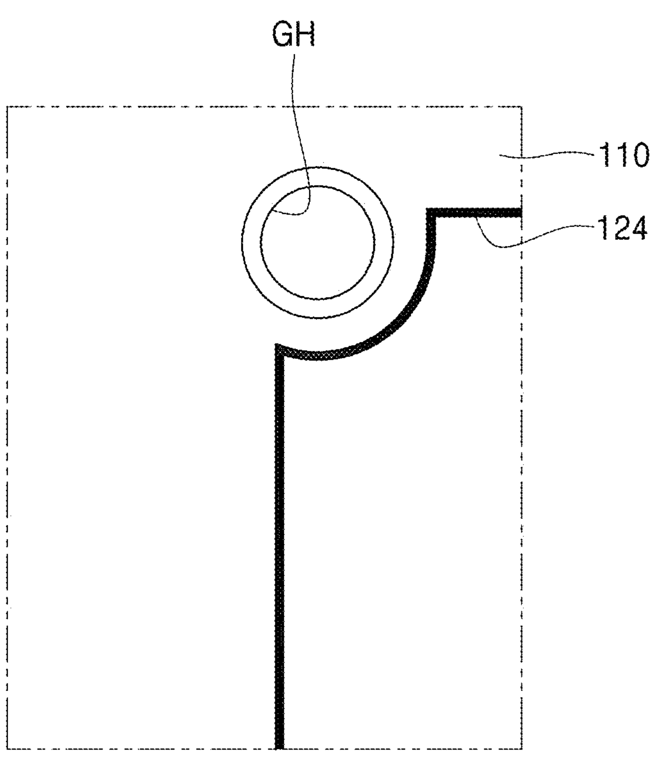
FIGS. 3A through 3C are enlarged plan views of enlarged wiring lines arranged in portions B, C, and D of the substrate of FIG. 1A.
Figure 3B:
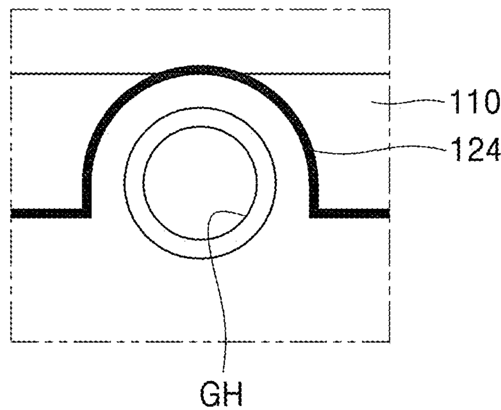
Figure 3C:
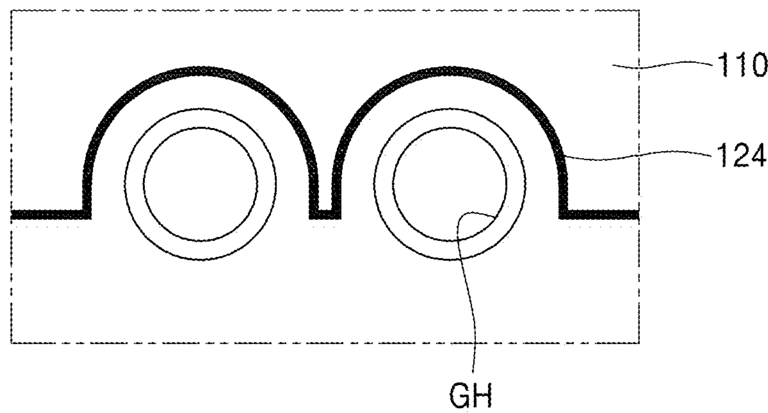

FIGS. 3A through 3C are enlarged plan views of enlarged wiring lines arranged in regions B, C, and D of the substrate of FIG. 1A. Descriptions are to be given with reference to FIG. 1A together, and the descriptions already given with reference to FIGS. 1A through 2B are briefly described or omitted.

Referring to FIGS. 3A through 3C, the test wiring 124 may be arranged on the substrate body 110 in a form of bypassing the guide ring GH. In other words, in each of FIGS. 3A through 3C, the test wiring 124 may have a partial shape of a circle bypassing toward the inner side of the substrate body 110. In this case, the inner side of the substrate body 110 may mean a side toward the active region in which the semiconductor chips 130 are arranged.

The bypassing structure of the test wiring 124 is not limited toward the inner side of the substrate body 110, but may also bypass toward the outer side of the substrate body 110. In addition, the bypassing structure of the test wiring 124 is not limited to a partial shape of a circle, but may also have a partial shape of a polygon. For example, in FIG. 3A, the test wiring 124 may bypass the guide ring GH in an 'L' shape. For example, in FIG. 3B, the test wiring 124 may bypass the guide ring GH in an 'Il' shape.

In the substrate 100 of the present example embodiment, although the test wiring 124 is illustrated to include one wiring line, the number of wiring lines of the test wiring 124 is not limited to one. For example, the number of wiring lines of the test wiring 124 may be plural. In addition, when the number of wiring lines of the test wiring 124 is plural, either all of the wiring lines may be arranged to surround the outer periphery portion of the substrate body 110, or at least a portion thereof may be arranged in a shape to pass the inside of the substrate body 110, that is, the active region.

When the number of wiring lines of the test wiring 124 is plural and all of the wiring lines are normal, in the test by using the test element 200, the wiring lines may have a magnitude of a first current and a magnitude of a first resistance. When some of the wiring lines of the test wiring 124 are disconnected, in the test using the test element 200, the wiring lines of the test wiring 124 may have a magnitude of a second current and a magnitude of a second resistance. In this case, the first current may be greater than the second current, and the first resistance may be less than the second resistance. On the other hand, when all the wiring lines of the test wiring 124 are disconnected, in a test using the test element 200, no current may flow and the resistance may be close to infinity.

Figure 4A:
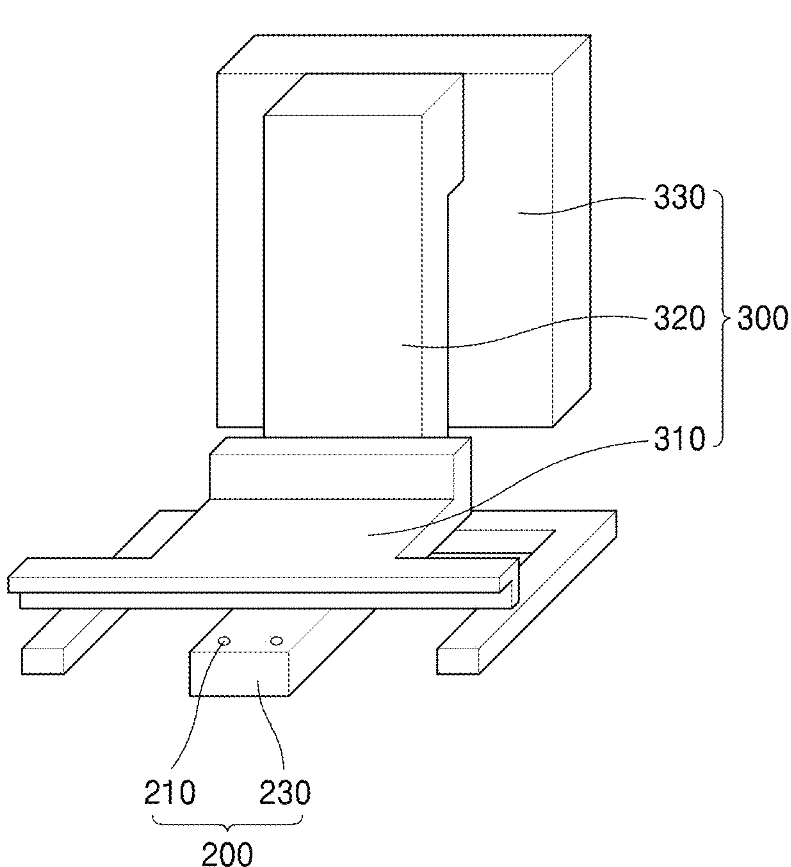
FIGS. 4A and 4B are a perspective view and a cross-sectional view of a gripper portion, respectively, in which test elements of a substrate test apparatus is arranged, according to an example embodiment.
Figure 4B:
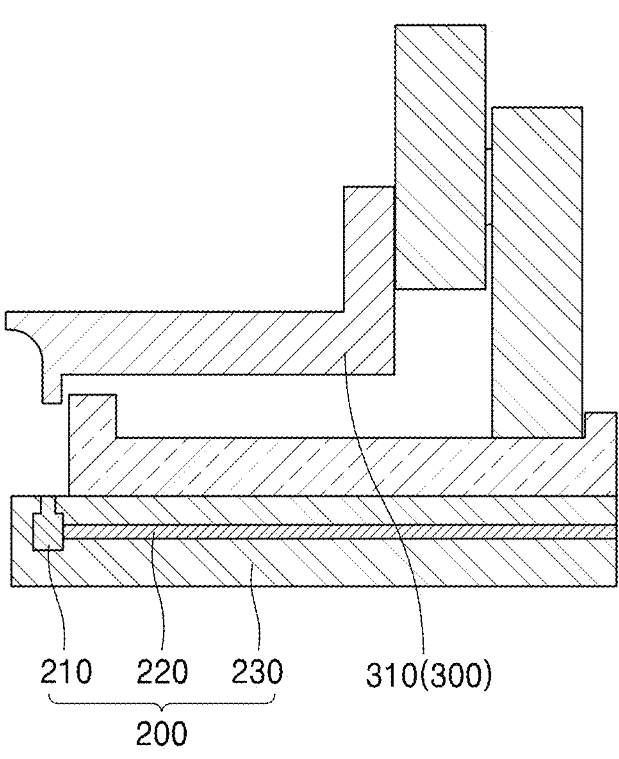

FIGS. 4A and 4B are a perspective view and a cross-sectional view of the gripper 300 portion, respectively in which the test element 200 of the substrate test apparatus 1000 is arranged, according to an example embodiment. The contents already described in the descriptions given with reference to FIGS. 1A through 3C are briefly described or omitted.

Referring to FIGS. 4A and 4B, the gripper 300 may include a contact unit 310, a connection unit 320, and a gripper body 330. The contact unit 310 of the gripper 300 may have the width corresponding to the short side of the substrate 100, and may grip the substrate 100. The contact unit 310 may be connected to the gripper body 330 via the connection unit 320. In addition, the contact unit 310 may grip the substrate 100 or move the substrate 100 by using up, down, left, and right movements of the gripper body 330. A portion of the test element 200 of the substrate test apparatus (refer to 1000 FIG. 7A) of the present example embodiment may be arranged at the contact unit 310 of the gripper 300. For reference, the substrate test apparatus 1000 may include the substrate 100 and the test element 200. The substrate test apparatus 1000 may include only the test circuit 120 and the test element 200, and the substrate body 110 may correspond to a test target. However, as the test circuit 120 is arranged on the substrate body 110, for convenience, the entire substrate 100 including the test circuit 120 may be treated as a component of the substrate test apparatus 1000.

Figure 7A:
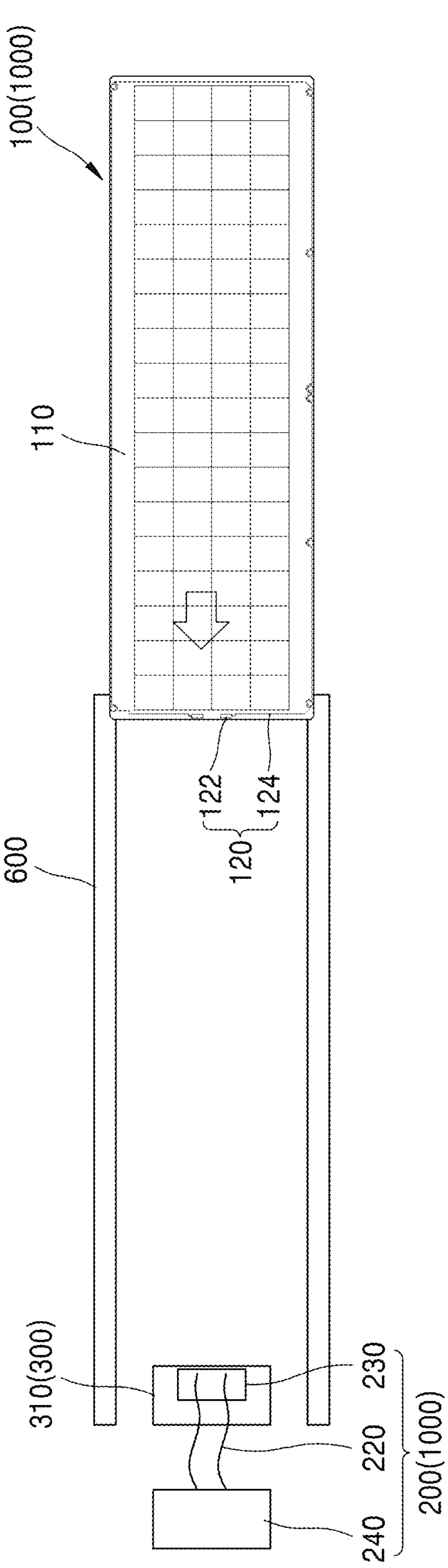
FIGS. 7A through 7D are conceptual diagrams of processes, in which a substrate test apparatus is applied to a molding operation, according to an example embodiment.

As illustrated in FIG. 4B, the test element 200 may include the probe pin 210, a probe wiring 220, a probe housing 230, and a test body (refer to 240 in FIG. 7A). The probe pin 210 may be arranged in the probe housing 230, and when the contact unit 310 of the gripper 300 grips the substrate 100, the probe pin 210 may contact the contact pad 122 of the test circuit 120 of the substrate 100. The probe wiring 220 may electrically connect the probe pin 210 to the test body 240. The probe pin 210 and at least a portion of the probe wiring 220 may be arranged in the probe housing 230.

The test body 240 may include a device for generating a current or an electrical signal. In addition, the test body 240 may apply a current or an electrical signal to the test circuit 120. Furthermore, the test body 240 may include a determination unit for determining the state of the substrate 100 based on a detected result, and a display unit for notifying the determination result to the outside. In this case, the display unit may include a display device, such as a buzzer generating sound, a lamp generating light, and a monitor. On the other hand, according to some example embodiments, in a computer (e.g., at least one processor included in or associate with the test element 200) in which software of a determination function is executed, by receiving the detected result from the test body 240, the state of the substrate 100 may be determined, and the operation of the display unit may also be controlled.

Figure 5A:
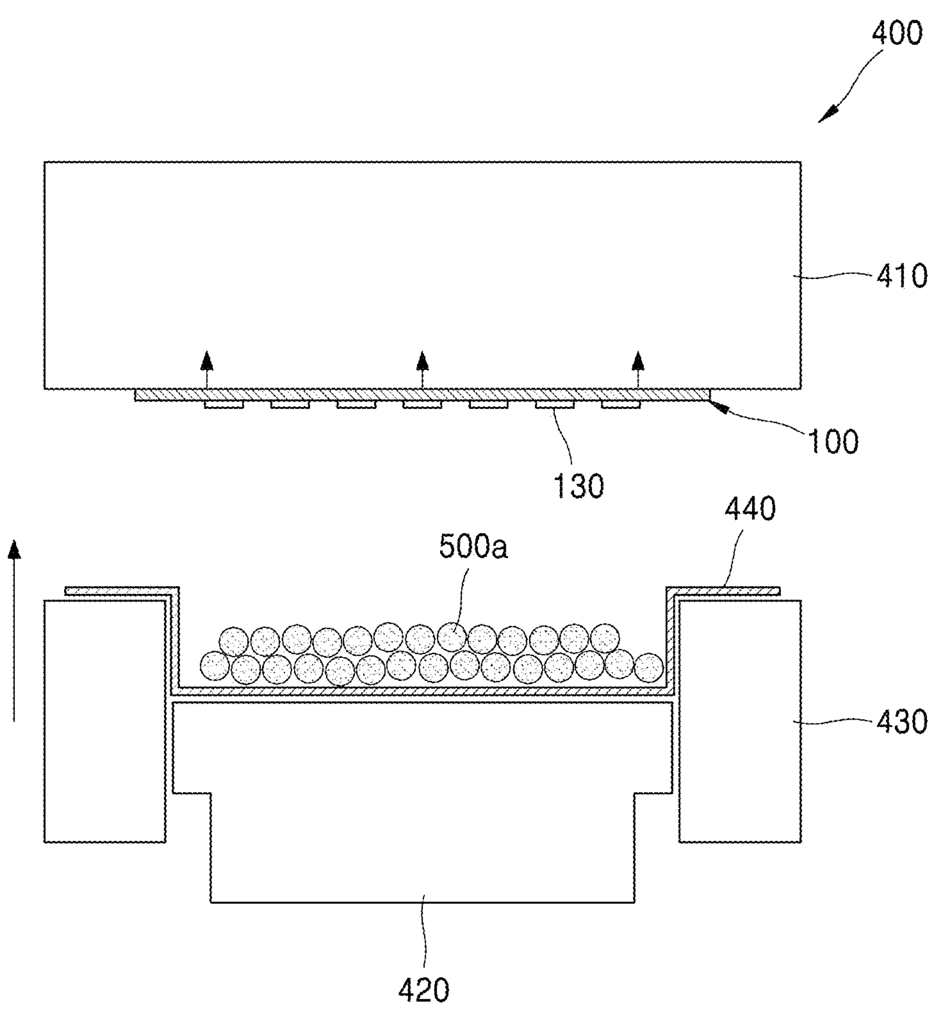
FIGS. 5A and 5B are conceptual diagrams illustrating a process of molding a substrate, after a state of a substrate has been determined by applying a substrate test apparatus, according to an example embodiment.
Figure 5B:
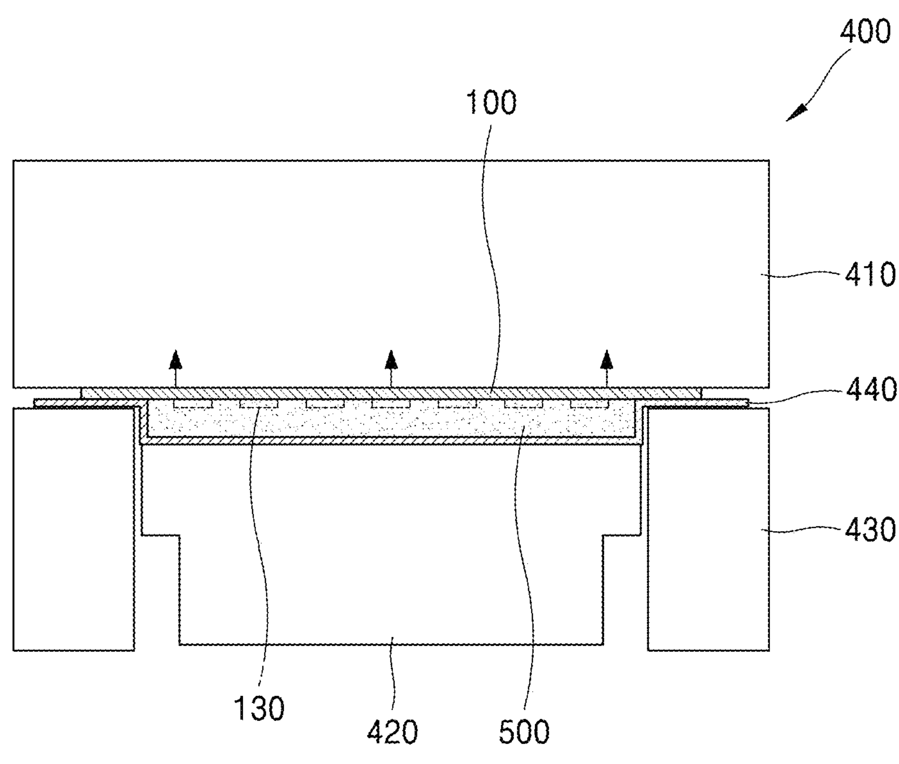

FIGS. 5A and 5B are conceptual diagrams illustrating a process of molding the substrate 100, after a state of the substrate 100 has been determined by applying the substrate test apparatus 1000, according to an example embodiment.

Referring to FIG. 5A, in the molding process, the substrate 100 of the present example embodiment may be introduced into a mold 400 of the molding equipment and the molding process may be performed. The substrate 100 of the present example embodiment may include a substrate determined to be in a normal state, in a test using the test circuit 120 and the test element 200. For reference, the molding equipment may include the gripper 300, the mold 400, the rail 600, a substrate movement apparatus (not illustrated), etc. The substrate movement apparatus may move the substrate 100 loaded onto the rail 600 to the position of the mold 400.

The mold 400 may include an upper mold 410, a lower mold 420, and a mold movement apparatus 430. According to some example embodiments, the lower mold 420 may be referred to as a cavity, the mold movement apparatus 430 may be referred to as a moving plate, and the lower mold 420 and the mold movement apparatus 430 may be combined together and be referred to as a lower mold. As indicated by a short arrow, the substrate 100 may be fixed to the upper mold 410 by using vacuum adsorption. A molding resin 500_a_ of a granule-shape may be arranged above the lower mold 420. For example, the molding resin 500_a_ may include EMC. On the other hand, a release film 440 may be attached to the lower mold 420 to protect the lower mold 420 in the molding process, and to facilitate separation from the EMC after the molding process. When the molding process is performed, as indicated by a long arrow, the lower mold 420 may rise upward together with the mold movement apparatus 430.

Referring to FIG. 5B, as the lower mold 420 rises, heat and pressure may be applied to the inside of the lower mold 420. Accordingly, the molding resin 500_a_ of the granule-shape may be changed into a fluidized liquid phase. In addition, as a certain amount of pressure is applied, a molding resin 500 in the fluidized liquid phase may densely fill spaces between the semiconductor chips 130 mounted on the substrate 100. In the case of the substrate 100 of the present example embodiment, because the substrate 100 has been tested to be in a normal substrate without cracks or tears, the molding process may be smoothly performed. Accordingly, the molding resin 500 may be normally molded with an appropriate thickness on the substrate 100. In addition, the molding resin 500 may not cause damage to the mold, especially the upper mold 410 at all.

The molding processes of FIGS. 5A and 5B may correspond to a compression molding process. However, the molding process, after a state of the substrate 100 has been determined by applying the substrate test apparatus 1000 of the present example embodiment, is not limited to the compression molding process. For example, the substrate test apparatus 1000 according to the present example embodiment may also be applied to a transfer molding process. In addition, the substrate test apparatus 1000 of the present example embodiment may not be limited to a substrate such as a PCB, and may also be applied to a wafer molding process, in which molding is performed in a wafer state.

For reference, the transfer molding process may mean a process, in which molding is performed while a liquid molding resin, such as liquid EMC, is injected into one side, for example, one of the two long sides of the substrate, and the liquid EMC flows into the other side, that is, the other of the two long sides thereof. In the transfer molding process, a side, to which the molding resin is injected, may be referred to as a gate, and a side, from which air is sucked or discharged, may be referred to as a vent.

Figure 6A:
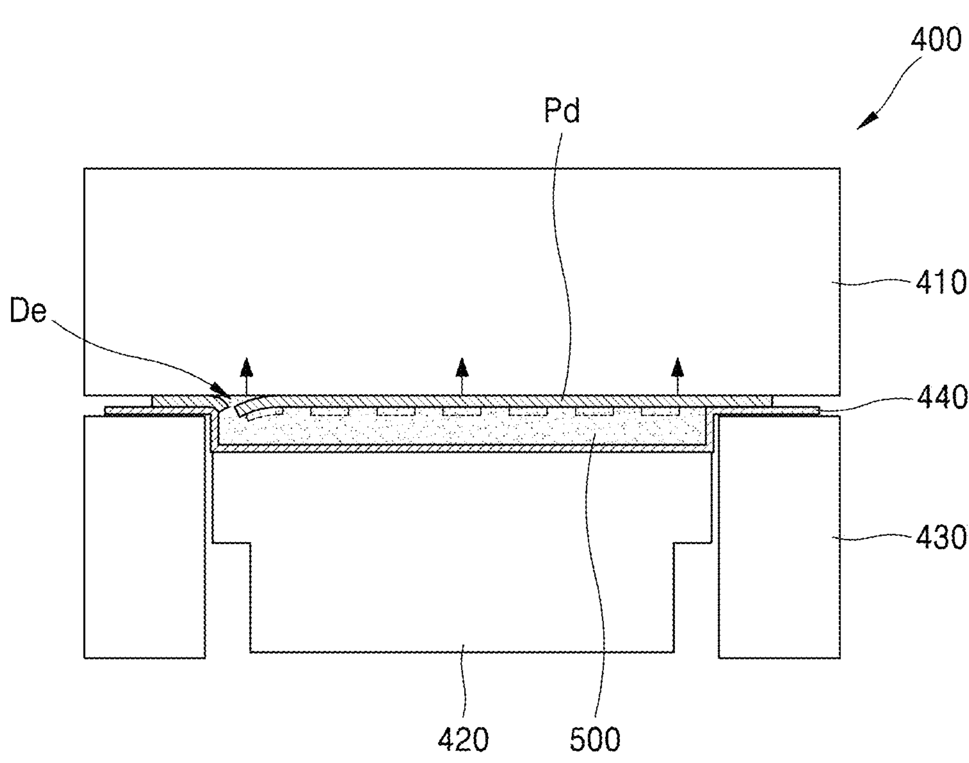
FIGS. 6A and 6B are a conceptual diagram of a case, in which a damaged substrate is used for a molding process and photos illustrating package damage of the case and a contamination state of molding equipment, respectively.
Figure 6B:
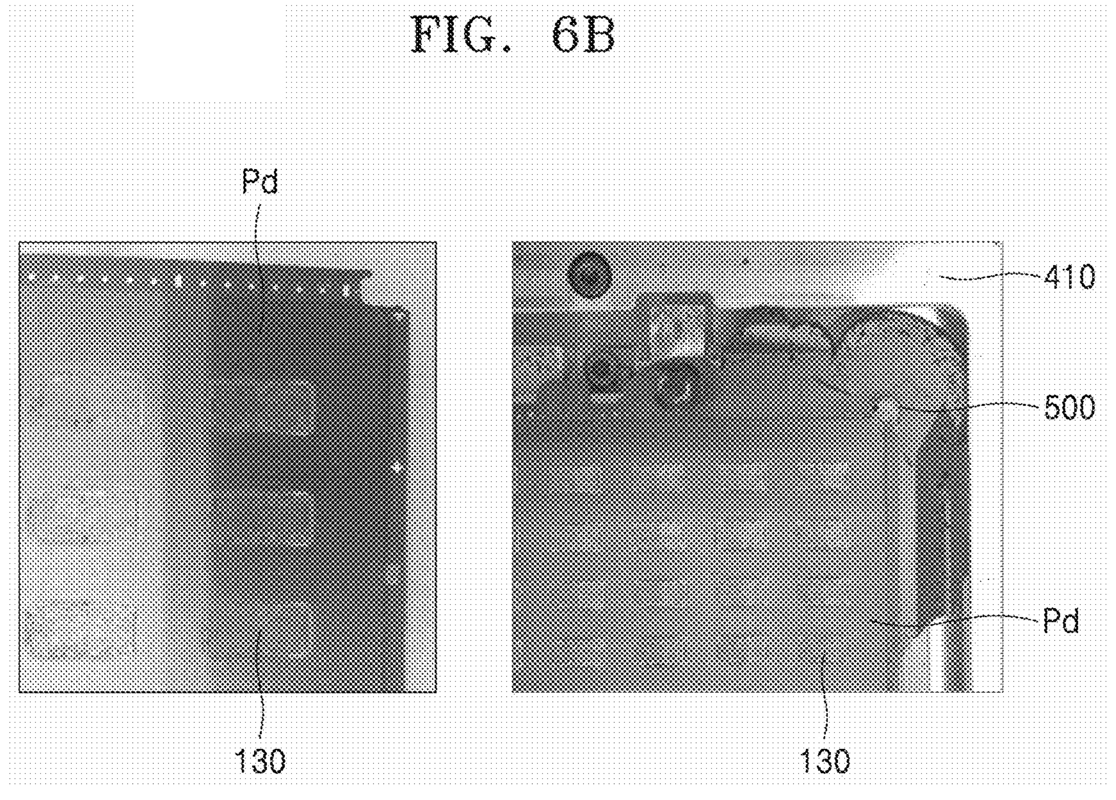

FIGS. 6A and 6B are a conceptual diagram of a case, in which a damaged substrate is used for a molding process, and photos illustrating package damage of the case and a contamination state of molding equipment, respectively.

Referring to FIGS. 6A and 6B, when a damaged substrate Pd is introduced into the mold 400 in the molding process, the molding resin 500 in the liquid phase, for example, liquid EMC, may be leaked into a damaged portion De of the damaged substrate Pd. Such leakage of the molding resin 500 may cause molding defects, such as a decrease in the thickness of the molding resin 500 or an occurrence of voids in the damaged substrate Pd. In addition, due to the leakage of the molding resin 500, the molding resin 500 may flow into the upper mold 410, contaminate and damage the upper mold 410, and cause failure defects of the molding equipment.

The left photograph in FIG. 6B may show a defect, in which the thickness of the molding resin 500 has been reduced after the molding process on the damaged substrate Pd is performed. In other words, a defect, in which the semiconductor chips 130 are exposed to the outside, may occur due to a decrease in the thickness of the molding resin 500. In addition, the right photograph in FIG. 6B may show a state, in which the upper mold 410 is contaminated and blocked by the molding resin 500, for example, EMC, along with a defect of the thickness reduction of the molding resin 500.

FIGS. 7A through 7D are conceptual diagrams of processes, in which the substrate test apparatus 1000 is applied to a molding process, according to an example embodiment. Descriptions are to be given with reference to FIG. 1A together, and the descriptions already given with reference to FIGS. 1A through 6B are briefly described or omitted.

Referring to FIG. 7A, to perform a molding process, firstly, the substrate 100 may be inserted onto the rail 600 of the molding equipment. The contact unit 310 of the gripper 300 of the molding equipment may grip short side portions of the substrate 100 and move the substrate 100 in a thick arrow direction, to introduce the substrate 100 onto the rail 600. As illustrated in FIG. 7A, a portion of the test element 200, for example, the probe pin (refer to 210 in FIG. 4B) and the probe housing 230 may be arranged in the contact unit 310 of the gripper 300. As described above, the test body 240 of the test element 200 may be connected to the probe pin 210 via the probe wiring 220.

On the other hand, the substrate 100 may include the substrate 100 of FIG. 1A. Accordingly, the substrate 100 may include the test circuit 120 arranged in the substrate body 110. In addition, the test circuit 120 may include the contact pad 122 and the test wiring 124.

Figure 7B:
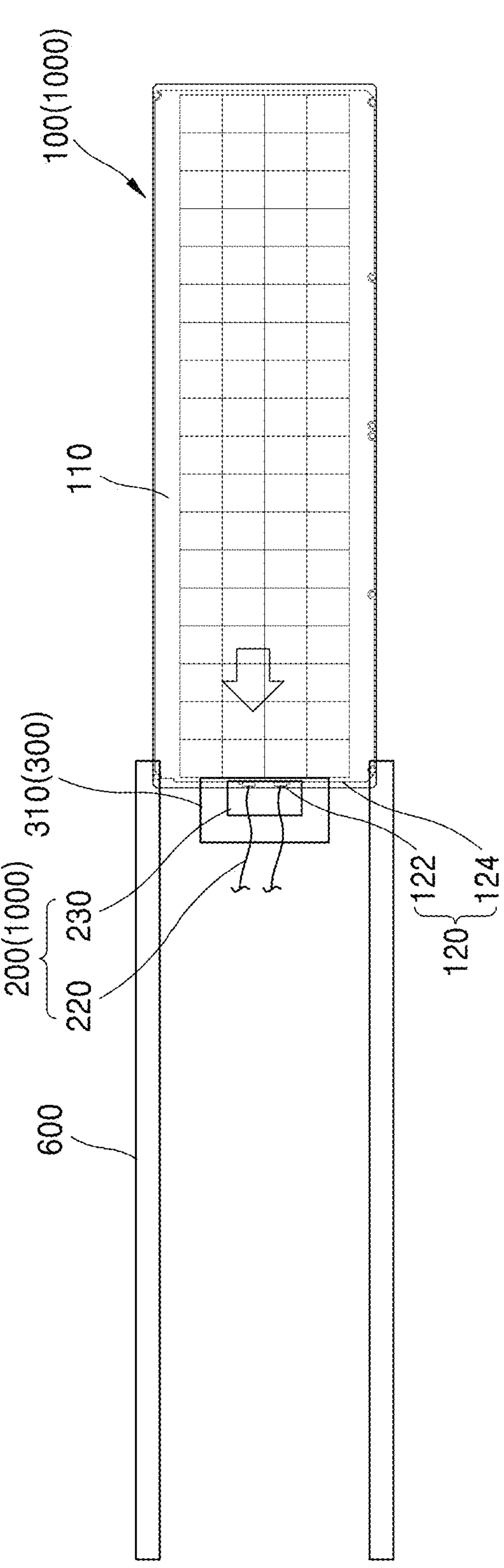

Referring to FIG. 7B, to insert the substrate 100 onto the rail 600, the gripper 300 may move toward the substrate 100, and the contact unit 310 of the gripper 300 may be coupled to the short side portion of the substrate 100. In the coupling of the contact unit 310 of the gripper 300 to the short side portion of the substrate 100, the probe pin 210 in the probe housing 230 may contact the contact pad 122 of the test circuit 120 of the substrate 100.

Thereafter, the test body 240 of the test element 200 may apply a current or an electrical signal to the test circuit 120 of the substrate 100 via the probe pin 210. As described above, when the substrate 100 is normal, the test wiring 124 may be in a closed state, and thus, a current may flow through the test circuit 120. For example, a resistance value of about several to several tens of Ω may be measured in the test element 200. However, when the substrate 100 is in a defective state, for example, when there is a crack or tear in the substrate 100, the test wiring 124 may be in an open state, and thus, no current may flow through the test circuit 120. For example, in the test element 200, a large resistance value of almost infinity (∞) may be measured.

Figure 7C:
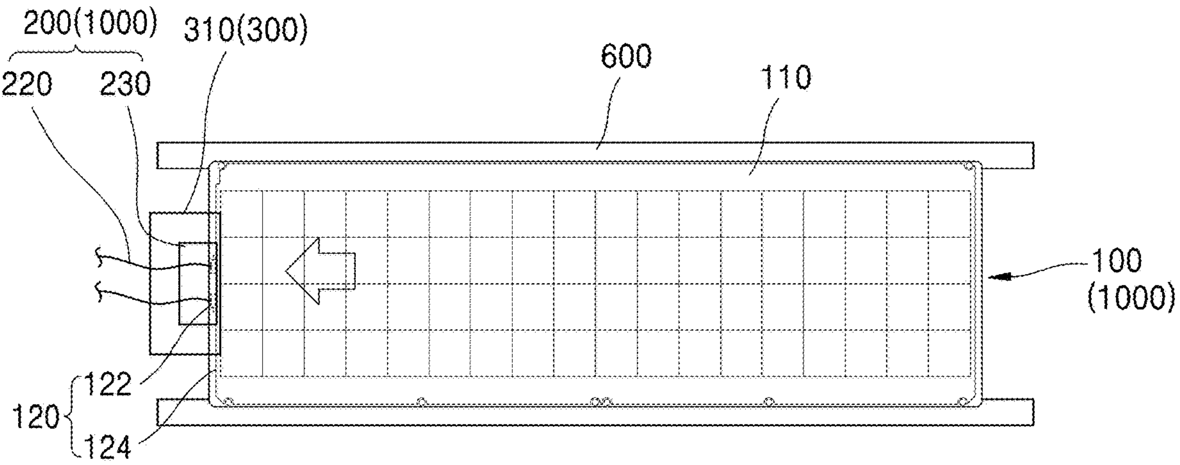

Referring to FIG. 7C, when the state of the substrate 100 is determined as normal, the gripper 300 may move the substrate 100 to the right as indicated by the thick arrow, and insert and seat the substrate 100 onto the rail 600. Thereafter, the substrate movement apparatus may move the substrate 100 from the rail 600 to the position of the mold 400, and as described with reference to FIGS. 5A and 5B, the molding process may be performed in the mold 400.

Figure 7D:
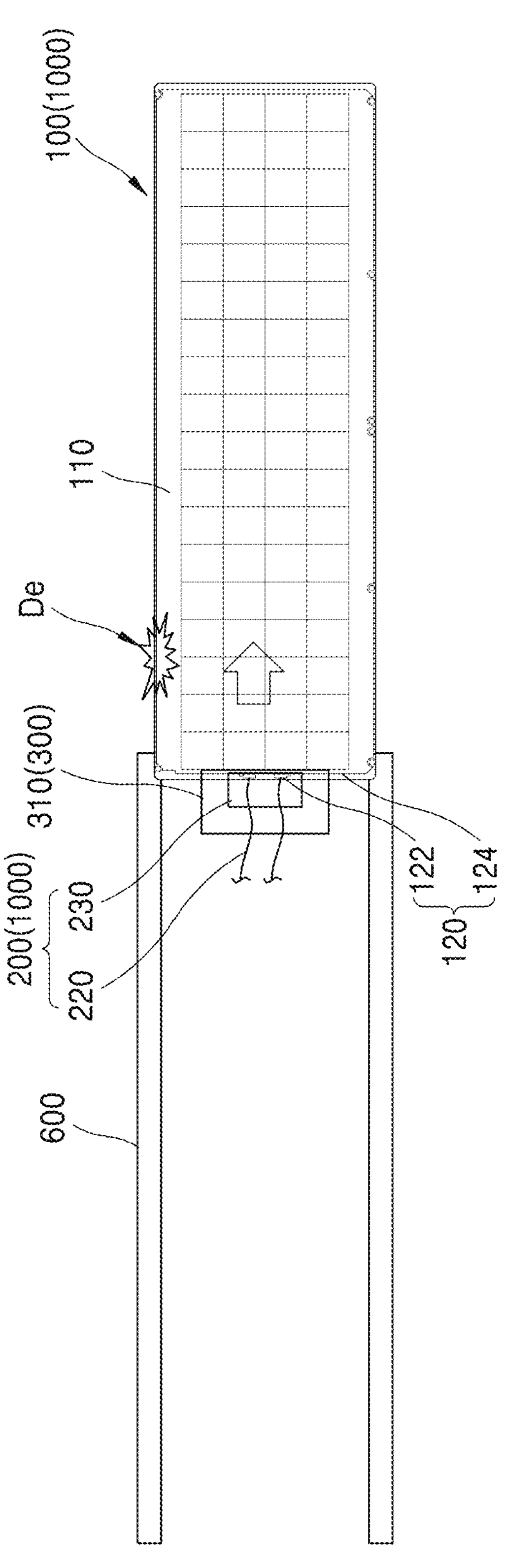

Referring to FIG. 7D, when the state of the substrate 100 is determined as abnormal, that is, when the substrate 100 has a defect De, such as crack and tear, the substrate 100 may not be inserted onto the rail 600, but may be discharged in an opposite direction as indicated by the arrow. Accordingly, the molding process for the corresponding substrate 100 may not be performed. By not performing the molding process on the damaged substrate 100, issues generated due to performing the molding process on the damaged substrate may be avoided or prevented in advance, and the productivity of the molding process may be improved.

Figure 8A:
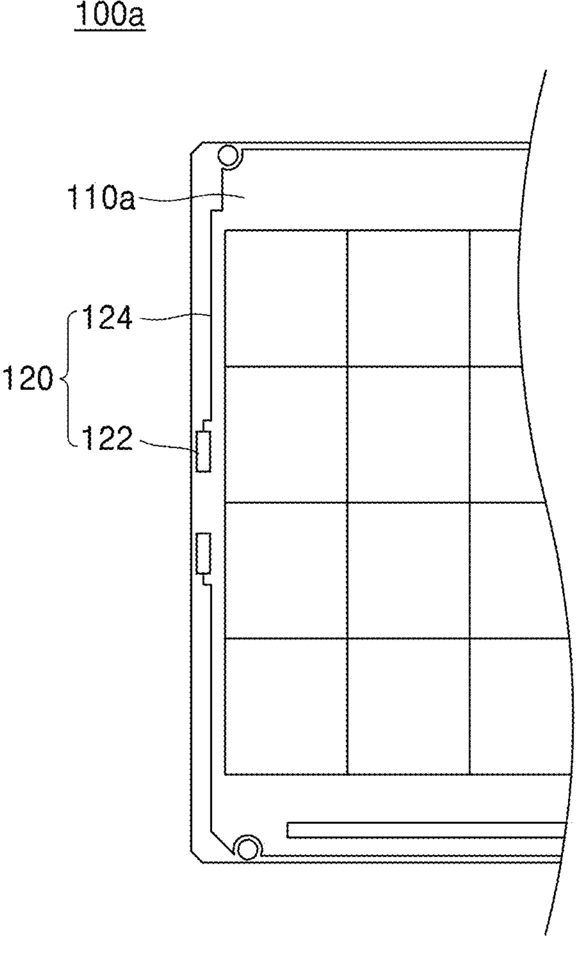
FIGS. 8A and 8B are plan views of a substrate including a test circuit, according to some example embodiments.
Figure 8B:
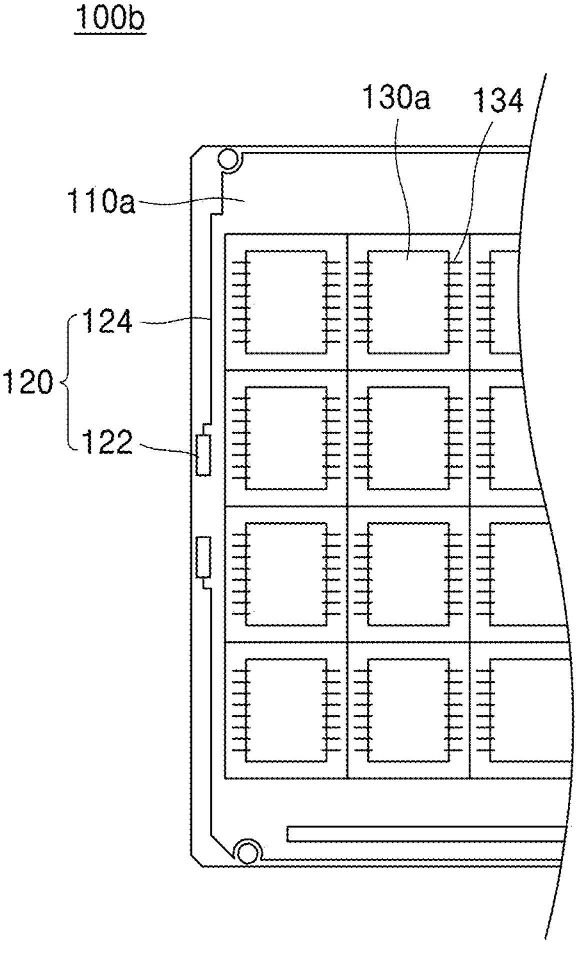

FIGS. 8A and 8B are plan views of the substrate 100*a* including a test circuit 120, according to some example embodiments. Descriptions already given with reference to FIGS. 1A through 7D are briefly described or omitted.

Referring to FIG. 8A, the substrate 100*a* may be different from the substrate 100 of FIG. 1A from a point that the substrate 100*a* is a substrate for die attachment. In other words, the substrate 100*a* may basically include a substrate body 110*a* and the test circuit 120, and may not include a semiconductor chip. The substrate body 110*a* and the test circuit 120 may be the same as or substantially similar to the substrate body 110 and the test circuit 120 in the substrate 100 of FIG. 1A, respectively.

The substrate 100*a* may also be inserted onto and/or moved to a die attachment equipment via the gripper (refer to 300 in FIG. 4A). In addition, when the gripper 300 is coupled to the substrate 100*a*, the state of the substrate 100*a* may be tested by using the test element (refer to 200 in FIG. 4B). The test operation and principle of the test element 200 may be the same as those described with respect to the substrate 100 of FIG. 1A.

Referring to FIG. 8B, the substrate 100*b* may be different from the substrate 100 of FIG. 1A in that the substrate 100*b* is a substrate for wire bonding. The substrate 100*b* may include the substrate body 110*a*, the test circuit 120, and the semiconductor chip 130. The semiconductor chip 130 may be fixed on the substrate 100*b* via an adhesive layer. The substrate body 110*a* and the test circuit 120 may be the same as described with respect to the substrate 100 and the test circuit 120 in the substrate 100 of FIG. 1A, respectively, except for that the arrangement structure of circuit wirings and/or pads in the substrate body 110*a* is changed for the wire bonding process.

The substrate 100*b* may also be inserted and/or moved onto a wire bonding equipment via the gripper 300. In addition, when the gripper is coupled to the substrate 100*b*, the state of the substrate 100*b* may be tested by the test element 200. The test operation and principle of the test element 200 may be the same as those described with respect to the substrate 100 of FIG. 1A.

On the other hand, in FIG. 8B, for convenience, a structure, in which semiconductor chips 130*a* are mounted by wire bonding on the substrate body 110*a* after the wire bonding process, is illustrated. However, in reality, the substrate 100*a* may be coupled to the gripper 300 and tested by the test element 200 in a state, where wires 134 are not connected to the semiconductor chips 130*a*, and the substrate 100*b* having passed the test may be inserted onto the wire bonding equipment. Accordingly, the substrate 100*b* of FIG. 8B may show the state after the test is passed and the wire bonding process is performed. In addition, after the wire bonding process, the semiconductor chips 130*a* on the substrate 100*b* may be electrically connected to the circuit wiring of the substrate body 110*a* via the wires 134.

In addition, in a state where semiconductor chips 130 and 130*a* are respectively attached to the substrate bodies 100 and 100*a*, the substrate 100 of FIG. 1A or the substrate 100*b* of FIG. 8B may be coupled to the gripper 300 for a molding process or wire bonding process, and a test on the substrate 100 of FIG. 1A or the substrate 100*b* of FIG. 8B may be performed by the test element 200. Accordingly, the substrate 100 of FIG. 1A or the substrate 100*b* of FIG. 8B may include the semiconductor chips 130 and 130*a* as components. On the other hand, the substrate 100*a* of FIG. 8A may include only the substrate body 110*a* and the test circuit 120, and may be coupled to the gripper 300 for the die attachment process, and a test on the substrate 100*a* of FIG. 8A may be performed by the test element 200. Accordingly, in the case of the substrate 100*a* of FIG. 8A, the semiconductor chips may be excluded from the components.

Figure 9A:
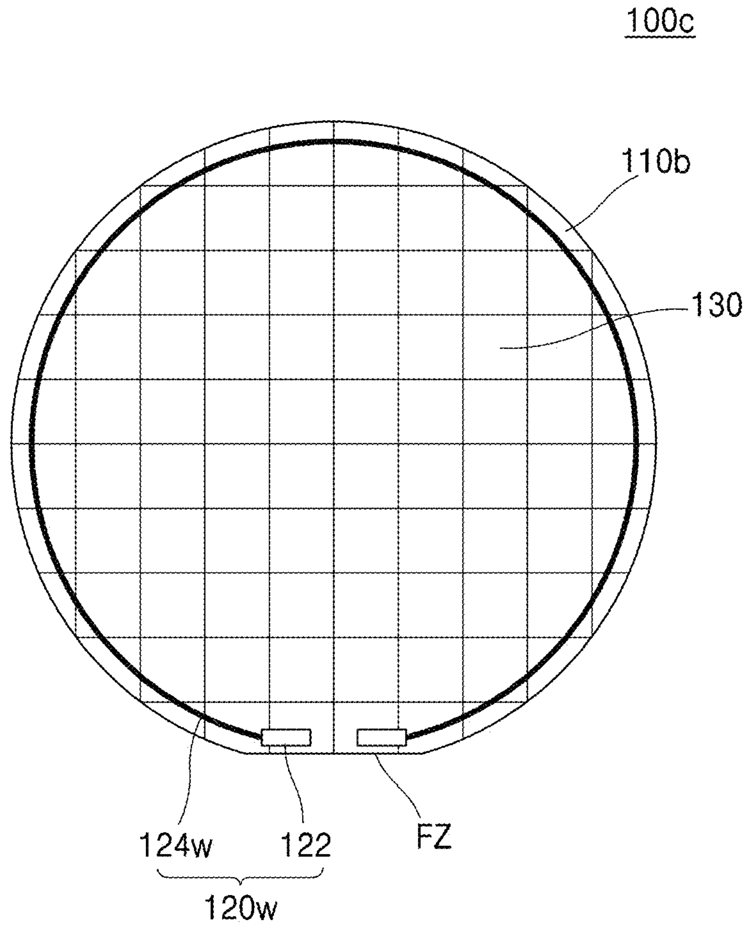
FIGS. 9A and 9B are plan views of a substrate including a test circuit, according to some example embodiments.
Figure 9B:
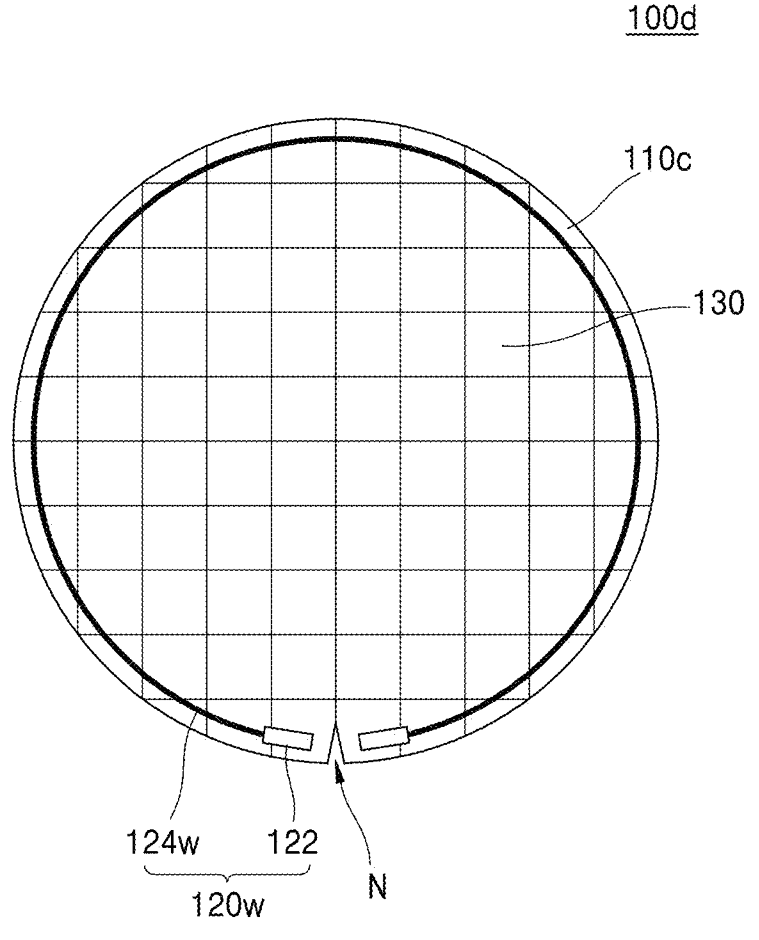

FIGS. 9A and 9B are plan views of a substrate 100*c* including the test circuit 120*a*, according to some example embodiments. The descriptions already given with reference to FIGS. 1A through 8 are briefly described or omitted.

Referring to FIG. 9A, the substrate 100*c* may include a substrate in a wafer state. In addition, the substrate 100*c* may include a substrate, in a wafer state, having a flat-zone FZ. For example, the substrate 100*c* may include an Si wafer. However, the substrate 100*c* is not limited thereto.

As illustrated in FIG. 9A, the substrate 100*c* may include a substrate body 110*b* and a test circuit 120*w*. The substrate body 110*b* may include a plurality of semiconductor chips 130 in a wafer state, which are not separated from each other. The test circuit 120*w* may include the contact pad 122 and a test wiring 124*w*, similar to the test circuit 120 of the substrate 100 of FIG. 1A. Two contact pads 122 may be arranged adjacent to the flat-zone FZ. The test wiring 124*w* may extend in a shape surrounding the outer periphery of the substrate body 110*b*. The test wiring 124*w* may be connected to any one contact pad 122 of the two contact pads 122, by starting from the other contact pad 122 of the two contact pads 122 and extending in a circular shape to surround the outer periphery of the substrate body 110*b*.

In the substrate 100*c*, the state of the substrate 100*b* may be tested by using the test circuit 120*w* and the test element (refer to 200 in FIG. 4B) in the molding process. The operation and principle of the test using the test circuit 120*w* and the test element 200 may be the same as described in the descriptions given with reference to FIG. 1A.

In FIG. 9A, the test wiring 124*w* of the test circuit 120*w* is illustrated to include one wiring line, but the number of wiring lines of the test wiring 124*w* is not limited to one. For example, the test wiring 124*w* may include a plurality of wiring lines. In addition, when the test wiring 124*w* includes the plurality of wiring lines, some of the wiring lines among the plurality of wiring lines may be arranged to pass through the center portion of the substrate body 110*b*.

In the case of molding the substrate 100*c* in the wafer state, the substrate 100*c* may be moved to the molding equipment via a robot-arm. In this case, the substrate 100*c* may be positioned on the robot-arm, and fixed onto the robot-arm via vacuum. The substrate 100*c* in the wafer state may also be tested on the robot-arm, or may also be tested before being moved by the robot-arm. For example, when the substrate 100*c* is tested on the robot-arm, some components of the test element 200, such as the probe pin 210 and the probe housing 230, may be arranged on the robot-arm. On the other hand, in the case of testing before the substrate 100*c* is moved by the robot-arm, the test element 200 may be positioned at a place other than the robot-arm, to test the substrate 100*c*.

On the other hand, the substrate 100*c* in the wafer state, moved to the molding equipment by the robot-arm, may be arranged inside the lower mold of the molding equipment, and a liquid molding resin, such as liquid EMC, may be discharged onto the wafer. Thereafter, heat and pressure may be applied as the mold is closed due to a vertical movement of the lower mold, and accordingly, the molding resin may be formed with an appropriate thickness on the substrate 100*c* in the wafer state.

Referring to FIG. 9B, a substrate 100*d* may be similar to the substrate 100*c* of FIG. 9B in that the substrate 100*d* is a substrate in the wafer state. However, the substrate 100*d* may be different from the substrate 100*c* of FIG. 9B in that the substrate 100*d* is a substrate, in the wafer state, including a notch N. The substrate 100*d* may also include an Si wafer. However, the substrate 100*d* is not limited thereto.

The substrate 100*d* may include a substrate body 110*c* and the test circuit 120*w*. The substrate body 110*c* may include a plurality of semiconductor chips 130 in a wafer state, which are not separated from each other. The test circuit 120*w* may include the contact pad 122 and the test wiring 124*w* similar to the test circuit 120*w* of the substrate 100*c* of FIG. 9A. Two contact pads 122 may be arranged adjacent to the notch N. In other words, the two contact pads 122 may be arranged with the notch N therebetween. The test wiring 124*w* may extend in a shape surrounding the outer periphery of the substrate body 110*c*.

In the molding process, the substrate 100*d* may be tested for the state thereof by using the test circuit 120*w* and the test element 200. In addition, the test circuit 120*w* may also include a plurality of wiring lines. In addition, some of the plurality of wiring lines may be arranged to pass through the central portion of the substrate body 110*d*.

While the inventive concepts have been particularly shown and described with reference to some example embodiments thereof, it will be understood that various changes in form and details may be made therein without departing from the spirit and scope of the following claims.

What is claimed is:

1. A substrate including a test circuit, the substrate comprising:

a substrate body; and the test circuit on at least one of an upper surface and a lower surface of the substrate body, wherein the test circuit comprises two contact pads and at least one test wiring, the two contact pads being at an end portion of the substrate body and configured to contact two probe pins of a test element, the at least one test wiring extending to surround a first outer periphery portion of the substrate body and configured to connect the two contact pads to each other, the at least one test wiring being a single integral body, and in an electrical test using the test element, when the at least one test wiring is in a closed state, the substrate body is determined as normal, and when the at least one test wiring is in an open state, the substrate body is determined as defective.

2. The substrate of claim 1, wherein the substrate body comprises a printed circuit board (PCB) of a rectangular shape extending in a first direction, the two contact pads are adjacent to a first short side among two short sides, and are at a central portion of the first short side in a second direction perpendicular to the first direction, and the at least one test wiring extends from a first contact pad among the two contact pads, along a first portion of the first short side, a first long side among two long sides, a second short side among the two short sides, a second long side among the two long sides, and a second portion of the first short side, to a second contact pad among the two contact pads.

3. The substrate of claim 2, wherein the substrate comprises a wire bonding substrate configured to wire-bond first semiconductor chips in a two-dimensional array structure on at least one surface of the substrate body, or the substrate comprises a die attachment substrate configured to attach second semiconductor chips in a two-dimensional array structure on the at least one surface of the substrate body.

4. The substrate of claim 2, wherein the substrate further comprises semiconductor chips in a two-dimensional array structure on at least one surface of the substrate body.

5. The substrate of claim 1, wherein the substrate body comprises a wafer of a circular shape, the two contact pads are on a partial area of a second outer periphery portion of the wafer that is adjacent to a flat-zone or a notch of the wafer, and the at least one test wiring extends from a first contact pad among the two contact pads, along the second outer periphery portion of the wafer in the circular shape, to a second contact pad among the two contact pads.

6. The substrate of claim 5, wherein the substrate comprises a plurality of semiconductor chips in a two-dimensional array structure in the substrate body.

7. The substrate of claim 1, wherein the closed state is a first state in which a first current flows when the first current is applied via the test element, and the open state is a second state in which a second current does not flow when the second current is applied via the test element.

8. A substrate test apparatus comprising:

a substrate including a substrate body, and a test circuit on at least one of an upper surface and a lower surface of the substrate body; and a test element configured to test the substrate, wherein the test circuit comprises two contact pads and at least one test wiring, the two contact pads being at an end portion of the substrate body and configured to contact two probe pins of the test element, the at least one test wiring extending to surround a first outer periphery portion of the substrate body and configured to connect the two contact pads to each other, the at least one test wiring being a single integral body, and in an electrical test using the test element, the substrate test apparatus is configured to determine the substrate as normal when the at least one test wiring is in a closed state, and determine the substrate as defective when the at least one test wiring is in an open state.

9. The substrate test apparatus of claim 8, wherein the substrate body comprises a printed circuit board (PCB) of a rectangular shape extending in a first direction, the two contact pads are adjacent to a first short side among two short sides, and are at a central portion of the first short side in a second direction vertical to the first direction, and the at least one test wiring extends from a first contact pad among the two contact pads, along a first portion of the first short side, a first long side among two long sides, a second short side among the two short sides, a second long side among the two long sides, and a second portion of the first short side, to a second contact pad among the two contact pads.

10. The substrate test apparatus of claim 9, wherein the test element is in a gripper that is configured to grip and move the substrate body, and when the gripper grips the substrate body, the test element is configured to perform the electrical test.

11. The substrate test apparatus of claim 9, wherein the substrate comprises a wire bonding substrate configured to wire-bond first semiconductor chips in a two-dimensional array structure on at least one surface of the substrate body, or the substrate comprises a die attachment substrate configured to attach second semiconductor chips in a two-dimensional array structure on the at least one surface of the substrate body.

12. The substrate test apparatus of claim 9, wherein the substrate further comprises semiconductor chips in a two-dimensional array structure on at least one surface of the substrate body.

13. The substrate test apparatus of claim 8, wherein the substrate body comprises a wafer of a circular shape, the two contact pads are on a partial area of a second outer periphery portion of the wafer that is adjacent to a flat-zone or a notch of the wafer, and the at least one test wiring extends from a first contact pad among the two contact pads, along the second outer periphery portion of the wafer in the circular shape, to a second contact pad among the two contact pads.

14. The substrate test apparatus of claim 13, wherein the test element is on a wafer movement apparatus that is configured to contact at least a portion of the substrate body and move the substrate body, and when the wafer movement apparatus contacts the substrate body, the test element is configured to perform the electrical test.

15. The substrate test apparatus of claim 13, wherein the substrate comprises a plurality of semiconductor chips in a two-dimensional array structure in the substrate body.

16. A substrate test apparatus comprising:

a substrate including a substrate body and a test circuit, the test circuit on at least one of an upper surface and a lower surface of the substrate body;

a test element configured to test the substrate; and a substrate movement apparatus configured to move the substrate, the substrate movement apparatus having at least some components of the test element thereon, wherein the test circuit comprises two contact pads and at least one test wiring, the two contact pads being at an end portion of the substrate body and configured to contact two probe pins of the test element, the at least one test wiring extending to surround an outer periphery portion of the substrate body and configured to connect the two contact pads to each other, the at least one test wiring being a single integral body, when the substrate movement apparatus contacts the substrate, the test element is configured to perform an electrical test on the substrate, and in the electrical test, the substrate test apparatus is configured to determine the substrate as normal when the at least one test wiring is in a closed state, and determine the substrate as defective when the at least one test wiring is in an open state.

17. The substrate test apparatus of claim 16, wherein the substrate body comprises a printed circuit board (PCB) of a rectangular shape extending in a first direction, the substrate movement apparatus comprises a gripper configured to grip and move the substrate body, and when the gripper grips the substrate body, the test element is configured to perform the electrical test.

18. The substrate test apparatus of claim 16, wherein the substrate comprises a wire bonding substrate configured to wire-bond first semiconductor chips in a two-dimensional array structure on at least one surface of the substrate body, or the substrate comprises a die attachment substrate that is configured to attach second semiconductor chips in a two-dimensional array structure on the at least one surface of the substrate body.

19. The substrate test apparatus of claim 16, wherein the substrate body comprises a wafer of a circular shape, the substrate movement apparatus comprises a wafer movement apparatus configured to contact at least a portion of the substrate body and move the substrate body, and when the wafer movement apparatus contacts the substrate body, the test element is configured to perform the electrical test.

20. The substrate test apparatus of claim 16, wherein the substrate further comprises:

first semiconductor chips in a two-dimensional array structure on at least one surface of the substrate body, or second semiconductor chips in a two-dimensional array structure in the substrate body.

* * * * *